United States Patent
Matsushita et al.

(10) Patent No.: US 9,741,678 B2
(45) Date of Patent: Aug. 22, 2017

(54) LASER WELDING MACHINE AND LASER WELDING METHOD USING THE SAME

(71) Applicant: FUJI ELECTRIC CO., LTD., Kawasaki (JP)

(72) Inventors: Takeshi Matsushita, Matsumoto (JP); Yuta Tamai, Matsumoto (JP); Toshiyuki Miyasaka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 211 days.

(21) Appl. No.: 14/454,877

(22) Filed: Aug. 8, 2014

(65) Prior Publication Data

US 2015/0048068 A1 Feb. 19, 2015

(30) Foreign Application Priority Data

Aug. 14, 2013 (JP) .................. 2013-168672
Jul. 17, 2014 (JP) .................. 2014-147133

(51) Int. Cl.
*B23K 26/00* (2014.01)
*B23K 26/02* (2014.01)
(Continued)

(52) U.S. Cl.
CPC ............ *H01L 24/36* (2013.01); *B23K 26/037* (2015.10); *H01L 24/40* (2013.01); *B23K 26/067* (2013.01);
(Continued)

(58) Field of Classification Search
CPC . H01L 2224/40095; H01L 2224/48091; H01L 2224/40225; H01L 2224/40137;
(Continued)

(56) References Cited

U.S. PATENT DOCUMENTS 5,340,962 A * 8/1994 Schmidt ................. B23K 26/04
219/121.78
5,763,854 A * 6/1998 Dittman ............... B23K 1/0056
219/121.63
(Continued)

FOREIGN PATENT DOCUMENTS

CN 101073145 A 11/2007
JP 11-47970 2/1999
(Continued)

OTHER PUBLICATIONS

Chinese Office Action dated Dec. 28, 2016 in corresponding Chinese Patent Application No. 201410392696.7.

*Primary Examiner* — Dana Ross
*Assistant Examiner* — Hemant Mathew (57) ABSTRACT

A laser welding machine includes: an elevator that is capable of sliding an elevating platform; a pressing actuator that is fixed to the elevating platform at a base part of the pressing actuator and has a tip slidably connected to the base part and pressing a conductive upper terminal toward a conductive lower terminal; a laser oscillator; a machining optical device that is fixed to the elevating platform and has a lens to focus the laser light emitted from the laser oscillator; a position detector that detects a vertical positioning of the pressing actuator; a counter that receives an output of the position detector and delivers position information; and a control circuit that controls, based on the received signal from the counter, the elevator, the pressing actuator, and the machining optical device, and controls operation of the laser oscillator.

10 Claims, 4 Drawing Sheets

(51) Int. Cl.
  *B23K 26/10* (2006.01)
  *H01L 23/00* (2006.01)
  *B23K 26/035* (2014.01)
  B23K 26/067 (2006.01)
  B23K 26/08 (2014.01)
  B23K 101/38 (2006.01)

(52) U.S. Cl.
  CPC ...... *B23K 26/0884* (2013.01); *B23K 2201/38* (2013.01); *H01L 2224/40095* (2013.01); *H01L 2224/40137* (2013.01); *H01L 2224/40225* (2013.01); *H01L 2224/48091* (2013.01); *H01L 2224/73265* (2013.01); *H01L 2924/12042* (2013.01); *H01L 2924/13055* (2013.01); *H01L 2924/15747* (2013.01); *H01L 2924/19107* (2013.01)

(58) Field of Classification Search
  CPC . H01L 2224/73265; H01L 2924/12042; H01L 2924/13055; H01L 2924/19107; H01L 2924/15747; H01L 2924/00014; H01L 2924/00; H01L 24/40; H01L 24/36; H01L 24/85; H01L 24/78; B23K 26/037; B23K 26/023; B23K 26/0639; B23K 26/063; B23K 26/067; B23K 26/246; B23K 26/0884; B23K 26/0807; B23K 26/032; B23K 2201/38; B23K 26/0853; B23K 2201/40; B23K 20/004; B23K 20/005; B23K 20/007; B23K 37/00–37/08; B23K 37/047; B23K 37/0531; B23K 37/0408; B23K 3/087; B23K 3/0676; B23K 1/008; B23K 9/028
  USPC ............ 219/121.64, 121.63, 121.61, 121.83, 219/121.6, 121.78, 121.79, 121.8, 121.82; 228/4.5, 44.7, 180.5, 904, 44.3, 44.5, 45, 228/46, 47.1, 48, 49.1, 49.2, 49.3, 49.4, 228/49.5, 49.6, 212, 213
  See application file for complete search history.

(56) References Cited

U.S. PATENT DOCUMENTS

| | | | |
|---|---|---|---|
| 2005/0011867 A1* | 1/2005 | Okuda | B23K 26/032 219/121.63 |
| 2006/0157455 A1* | 7/2006 | Kawai | B23K 26/0884 219/121.63 |
| 2007/0075054 A1* | 4/2007 | Nakamura | B23K 26/04 219/121.61 |
| 2008/0150102 A1 | 6/2008 | Yokomae et al. | |
| 2009/0224432 A1* | 9/2009 | Nagatomo | B23K 26/032 264/400 |
| 2012/0188365 A1* | 7/2012 | Stork | B23K 26/046 348/90 |

FOREIGN PATENT DOCUMENTS

| | | |
|---|---|---|
| JP | 11-129084 | 5/1999 |
| JP | 2005-64441 | 3/2005 |
| JP | 2005-116702 | 4/2005 |
| JP | 2008-42039 | 2/2008 |
| JP | 2008-98585 | 4/2008 |

* cited by examiner

LASER WELDING MACHINE AND LASER WELDING METHOD USING THE SAME

This application is based on, and claims benefit of foreign priority to Japanese Patent Application No. 2013-168672, filed on Aug. 14, 2013, in the Japanese Patent Office, and to Japanese Patent Application No. 2014-147133, filed on Jul. 17, 2014, in the Japanese Patent Office, the disclosures of both of which are incorporated herein by reference.

BACKGROUND

1. Field

Embodiments of the present invention relate to a laser welding machine and a laser welding method for joining a lead frame having a vertically separated construction in a process of assembling a power semiconductor module.

2. Description of Related Art

A large current carrying capacity as well as a small size are required recently by power semiconductor modules composing an inverter circuit used in motor control in electric vehicles and in elevator control. This causes high current density and large heat generation in power semiconductor chips such as insulated gate bipolar transistors (IGBTs) installed in power semiconductor modules. As a consequence, heat dissipation design has to be reviewed for conventional semiconductor modules with aluminum wire-connected construction.

Figure 4:
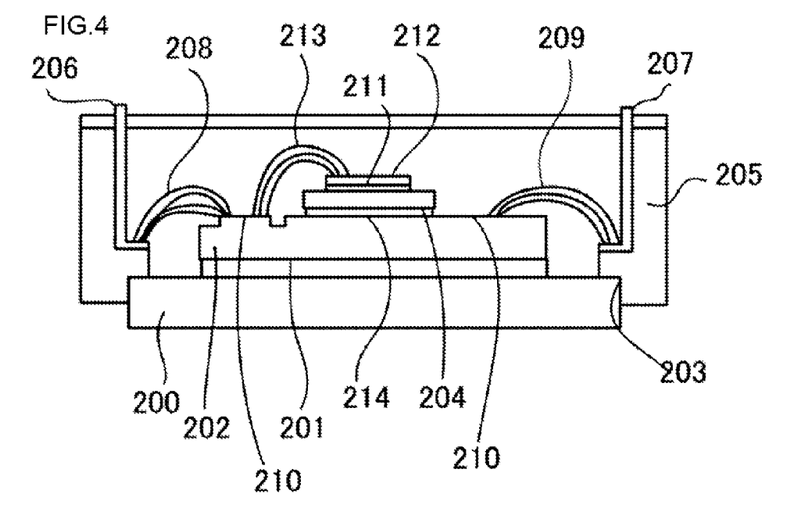
FIG. 4 is a sectional view of a part of a conventional semiconductor module installing an IGBT chip.

Patent Document 1 discloses a semiconductor module installing an IGBT chip as shown in FIG. 4, which is a sectional view of a basic construction part of this conventional semiconductor module. This semiconductor module comprises a copper base 200, which is a heat sink with a rectangular shape, an insulating substrate 202 with a rectangular shape joined through a solder 201 onto the copper base 200, and an IGBT chip 204 joined onto the insulating substrate 202. The upper periphery 203 of the copper base 200 is fitted and adhered to the lower inside part of a resin case 205 surrounding the IGBT chip 204 and the insulating substrate 202. Externally leading out terminals of an emitter terminal 206 and a collector terminal 207 are integrated monolithically with the resin case 205 on the side wall surface of the resin case 205 opposing each other in the resin case 205. The emitter terminal 206 and the collector terminal 207 are electrically connected through aluminum wires 208 and 209 to circuit patterns 210 and 214 formed on the surface of the insulating substrate 202, although the circuit pattern is not clearly depicted in FIG. 4. The circuit pattern 210 is connected through an aluminum wire 213 to an emitter electrode on the upper surface of the IGBT chip 204. A collector electrode on the back surface of the chip is electrically connected to the other circuit pattern 214. The emitter electrode and the collector electrode are not depicted in FIG. 4.

More specifically, the emitter electrode on the upper surface of the IGBT chip 204 is joined through solder 211 to a heat spreader 212. The heat spreader 212 is a metallic plate provided to enhance dissipation of heat generated by current conduction in the IGBT chip 204 and is electrically connected to the emitter electrode formed on the upper surface of the IGBT chip. To the upper surface of the heat spreader 212 connected by bonding is an end of the aluminum wire 213 mentioned previously, while the other end of the aluminum wire is connected by bonding to the circuit pattern 210 formed on the insulating substrate 202. Large current carrying capacity can be achieved by this construction of aluminum wire bonding connection to the chip upper surface through a heat spreader as disclosed in Patent Document 1.

Figure 5:
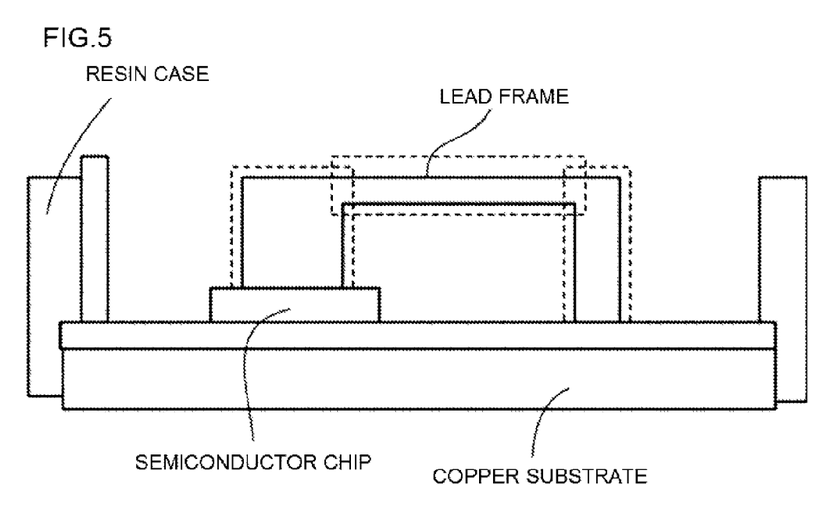
FIG. 5 is a schematic sectional view of a conventional semiconductor module that uses an upper terminal plate of a lead frame made of high thermal conductivity copper.

Patent Document 2 discloses another means for improving heat dissipation from the upper surface of a semiconductor chip, which uses a structure of surface terminal plate of a lead frame composed of modified cross-sectional plates with different thicknesses made of a high thermal conductivity copper plate as shown in FIG. 5 in place of aluminum wires connecting to the chip surface.

Patent Document 3 discloses a method to obtain a necessary terminal structure that uses a plurality of lead frames of copper in place of aluminum wires, on a heat spreader, a heat radiating plate, soldered on a semiconductor chip, and the plurality of lead frames are joined by laser welding.

Patent Document 4 discloses a structure in which a lead frame is divided into two parts: an electrode plate working as a heat spreader, and a wiring member, and after brazing the electrode plate onto the surface of a chip with a hard solder, the joining part of the wiring member is overlapped with the extension of the electrode plate, and then the two plates are joined by laser welding.

Patent Document 5 discloses a method of controlling a focal distance of a laser welding machine.

Patent Document 6 discloses a method of measuring and controlling a focal distance of a laser welding machine using a laser displacement meter or a contact type displacement meter, Patent Document 1

Japanese Unexamined Patent Application Publication No. 2005-116702 (FIG. 1 in particular)
Japanese Unexamined Patent Application Publication No. 2005-064441 (FIG. 1 in particular) Japanese Unexamined Patent Application Publication No. 2008-098585 (FIG. 5 in particular)
Japanese Unexamined Patent Application Publication No. 2008-042039 (FIG. 1 and Abstract in particular)
Japanese Unexamined Patent Application Publication No. 1999-129084 (Abstract in particular)
Japanese Unexamined Patent Application Publication No. 1999-047970 (paragraph 00015 in particular)

In the structure using a lead frame in place of an aluminum wire connection in order to enhance heat dissipation from the upper surface of a chip in view of down-sizing and large current carrying capacity of a semiconductor module, however, the lead frame needs a function for improving heat dissipation from the upper surface of the chip as well as a function of wire connection between the chip upper surface and the external terminal. The lead frame is preferably a thick metallic plate for the former function, while it is preferably a thin metallic plate for the latter function because a thin metallic plate can readily form a complicated wiring pattern. Although the lead frame of FIG. 5 composed of a modified cross-sectional material with partly different thicknesses satisfies the both functions, the manufacturing cost of such a lead frame may be very high.

Figure 6:
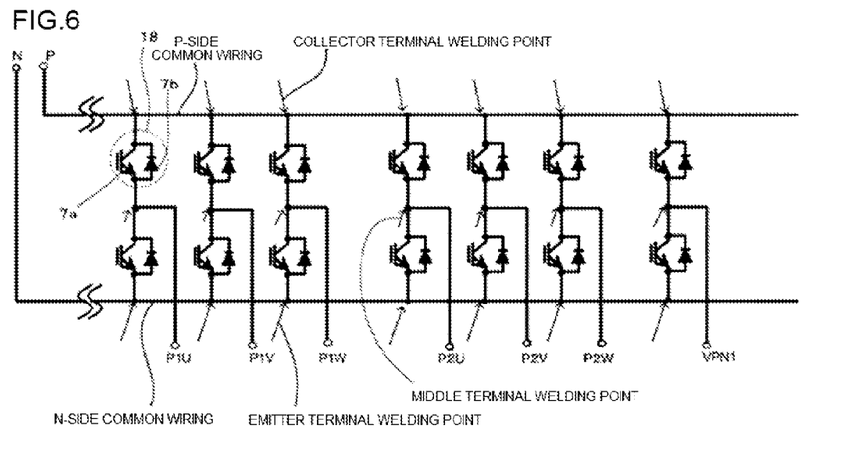
FIG. 6 is a schematic circuit diagram of an inverter circuit.

In the semiconductor device disclosed in Patent Document 3, the lead frame is divided into a heat spreader joined to the chip surface and a wiring member, which is a bus bar. Consequently, the lead frame cost of each section is inexpensive. However, the separated wiring member, which is a bus bar, and the heat spreader have to be laser welded at several places to integrate the sections into a single lead frame. When the semiconductor module composes an inverter circuit as shown in FIG. 6, the wiring members, which are bus bars, required in such semiconductor module are two types of a P bus bar of P side common wiring after rectification and an N bus bar of N side common wiring. Because the P bus bar and the N bus bar are preferably arranged in parallel at different vertical positions in view of down-sizing of the module and reduction of circuit inductance, the laser welding points are also positioned at different heights. In such a construction that needs a plurality of laser welding points in those positional relationship, the construction is desired to facilitate focus adjustment in laser irradiation for fast processing of laser welding.

Patent Document 5 mentioned earlier discloses a laser welding machine that conducts laser welding utilizing fed back positional information of the detected laser welding points. A semiconductor module composing an inerter circuit readily generates variations in distances between a pair of upper and lower terminals of a number of laser welding points at different vertical positions. Consequently, the laser welding machine disclosed in Patent Document 5 used for welding such a semiconductor module can generate many places of insufficient joining by the laser welding.

When many IGBT chips are arranged in a semiconductor module, the P and N bus bars are lengthy, and the variations in the distances between the upper and lower copper plate terminals can be large at many laser-welded places. Because of the large variation of the distances at the welded places, the laser welding process is not carried out uniformly and defective joint places are readily generated in the welding process. In a semiconductor module of high current carrying capacity which needs large sized semiconductor chips and an increased number of the chips, the length of the wiring member that is to be laser-welded also increases, increasing the chance of arising the above-described problem.

SUMMARY

Embodiments of the present invention have been made in view of the problems described above and an aspect of the present invention is to provide a laser welding machine and a laser welding method that achieve enough joint strength even through certain amount of variations exists in the distance between upper and lower metallic plates that are to be welded.

In accordance with the above aspect of the present invention, a laser welding machine of embodiments of the present invention is a laser welding machine for welding and fixing a plurality of conductive upper terminals with a plurality of conductive lower terminals, a lower surface of the upper terminal opposing an upper surface of the lower terminal, and the upper terminals being disposed at different vertical positions in a package for a semiconductor module. The laser welding machine comprises an elevating platform disposed above the conductive upper terminal and having an elevating control circuit. The elevating platform comprises a laser oscillator, a machining optical device including a lens to focus the emitted laser light, and a pressing actuator capable of self-elevating operation.

The pressing actuator presses the conductive upper terminal with a tip of the pressing actuator in contact with the terminal and performs a height detecting function that measures the vertical position of the conductive upper terminal, the detected vertical position information being fed back to the elevating control circuit, to adjust the height of the elevating platform for each of the plurality of conductive upper terminals and to establish a stable adhered condition between the conductive upper terminal and the conductive lower terminal.

And the laser welding machine irradiates laser light after establishing the stable adhered condition to weld the two terminals.

More specifically, a laser welding machine of embodiments of the invention is a laser welding machine conducting welding with laser light a device in which a conductive lower terminal is overlapped by a conductive upper terminal, the laser welding machine comprising; an elevator that is capable of sliding an elevating platform; a pressing actuator that is fixed to the elevating platform at a base part of the pressing actuator and has a tip slidably connected to the base part and pressing the conductive upper terminal toward the conductive lower terminal; a laser oscillator; a machining optical device that is fixed to the elevating platform and has a lens to focus the laser light emitted from the laser oscillator; a position detector that detects a vertical positioning of the pressing actuator; a counter that receives an output of the position detector and delivers position information; and a control circuit that controls, based on the position information received from the counter, the elevator, the pressing actuator, and the machining optical device, and controls operation of the laser oscillator.

The control circuit comprises a pressing regulation circuit, a laser focal distance signal output circuit, and a laser irradiation signal output circuit. The pressing regulation circuit makes the elevating platform slide until a change of an input signal from the counter corresponding to the amount of sliding of the elevating platform reaches a threshold value in order to obtain a close contact condition between the conductive upper terminal and the conductive lower terminal by sliding the elevating platform of the elevator. The laser focal distance signal output circuit delivers a signal for adjusting the laser focal distance to the machining optical device. The laser irradiation signal output circuit commands the laser oscillator to irradiate laser light.

Preferably, a power source of the pressing actuator is supplied by compressed air or a voltage. Preferably, a tip attached to the pressing actuator has such a configuration that does not shade the laser light and allows contact with a vicinity of a welding point in a time of laser irradiation. Preferably, the laser welding machine further comprises a suction nozzle having a suction port disposed at a vicinity of a welding point in a time of laser irradiation.

A laser welding method of embodiments of the invention uses the laser welding machine as stated above and comprises: pressing a vicinity of a laser welding point between the conductive upper terminal and the conductive lower terminal having the upper surface opposing to the lower surface of the upper terminal with the tip of the pressing actuator; measuring a displacement of the pressing actuator; repeating the pressing and measuring until the difference in displacement of the pressing actuator corresponding to increment of the pressing force of the pressing actuator converges within a predetermined range to establish an adhered state of stable clearance between the lower surface of the upper terminal and the upper surface of the lower terminal; and welding and fixing the both terminals.

More specifically, the laser welding method using the laser welding machine as stated previously comprises: repeatedly performing pressing regulated by the control circuit, performing arithmetic operation of a focal distance of laser light based on a vertical position of the laser irradiation point and delivering the operation results to the elevator and the machining optical device, and commanding the machining optical device to conduct laser irradiation. In the pressing, the control circuit makes the pressing actuator move to press the upper surface of the conductive upper terminal at a pressure of $P_0$ with the tip of the pressing actuator, and to press again at an increased pressure until the difference in the displacement of the pressing actuator measured according to the output signal from the counter between a value at the pressure $P_0$ and a value at a pressure larger than $P_0$ exerted by further moving the pressing actuator becomes within a predetermined range of $a_2$.

Embodiments of the present invention provide a laser welding machine and a laser welding method using the laser welding machine, in which enough joining strength is obtained even through some variation exists in the distance between upper and lower metallic plates to be laser-welded.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Some embodiments of a laser welding machine and a laser welding method using the laser welding machine of the present invention will be described in detail in the following with reference to the accompanying drawings. In the following description of the embodiment examples and the accompanying drawings, similar constructions are given the same symbols and repeated description is omitted. The accompanying drawings illustrated for the embodiment examples are not depicted in an accurate scale and a relative dimension for the sake of ease of observation or understanding. The present invention is not limited to the embodiment examples described in the following, but can be modified or varied within the spirit and scope of the invention.

Figure 2:
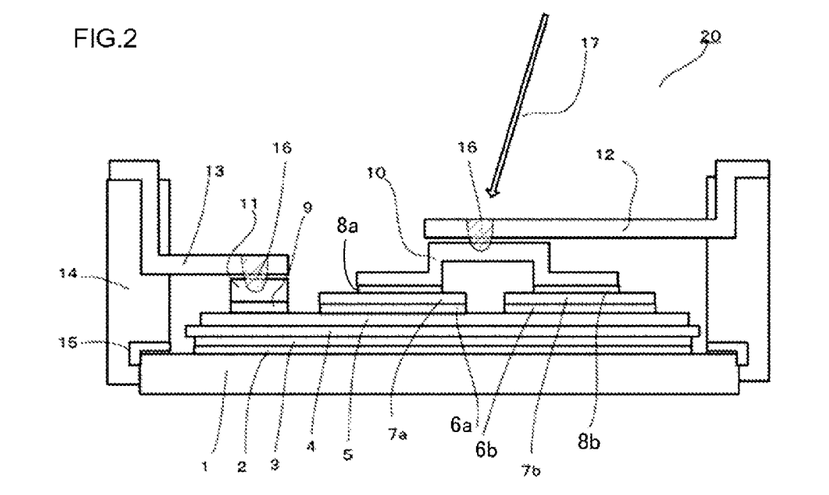
FIG. 2 is a sectional view of a part of a semiconductor module in a laser welding method of embodiments of the present invention showing a place of laser welding

FIG. 2 is a sectional view of an essential part of a semiconductor module 20 that comprises a direct copper bonding (DCB) circuit board consisting of a DCB back surface copper foil 3, a DCB ceramics 4, and a DCB front surface copper foil 5, semiconductor chips of an IGBT 7a and a diode 7b, a vertically divided lead frame composed of a lower terminal 10 and an upper terminal 12 and another vertically divided lead frame composed of a lower terminal 11 and an upper terminal 13, the both lead frames being disposed above the DCB circuit board and the semiconductor chips.

Laser light 17 is irradiated to the closely opposing surfaces of the lead frame to weld and integrate the lead frame. FIG. 2 indicates welded zones 16 of laser welding by regions of slanted lines. The sectional view of the semiconductor module 20 of FIG. 2 shows an assembled construction of the antiparallel-connected section of the IGBT 7a and the diode 7b indicated by the dotted circle 18 in the inverter circuit shown in FIG. 6, which will be described later. The sectional view of FIG. 2 shows that the emitter electrode of the IGBT 7a and the anode electrode of the diode 7b are commonly connected through the lower emitter terminal 10 to the upper emitter terminal 12 above the front surfaces of the chips, and that the collector electrode of the IGBT 7a and the cathode of the diode 7b are commonly connected to the DCB front surface copper foil 5 under the chips.

In assembling the semiconductor module shown in FIG. 2, a solder 2 is first put on an upper surface of a heat sink base 1. Then, a DCB circuit board is mounted so that the solder 2 becomes in contact with a DCB back surface copper foil 3. The DCB circuit board is composed of a DCB ceramics 4, a DCB back surface copper foil 3 disposed beneath the DCB ceramics 4, and a DCB front surface copper foil 5 disposed on the upper surface of the DCB ceramics 4. On the upper surface of the DCB front surface copper foil 5, solder 6a, 6b and solder 9 are arranged. On the solder 6a mounted is a chip of the IGBT 7a and on the solder 6b mounted is a chip of the diode 7b that is a free-wheeling diode (FWD).

A solder 8a is placed on the upper surface of the IGBT 7a and a solder 8b is placed on the upper surface of the diode 7b that is a FWD. Both ends of the emitter lower terminal 10 are mounted on the solders 8a and 8b, respectively, and a collector lower terminal 11 is mounted on the solder 9. The solders are heated and melted, and then cooled and solidified.

A resin case 14 is formed by molding monolithically an emitter upper terminal 12 and a collector upper terminal 13. Silicone adhesive 15 is applied to a bottom adhesion surface of the resin case 14, which is then fitted and adhered to the periphery of the heat sink base 1. The resin case 14 and the heat sink base 1 are joined firmly by heating and hardening the silicone adhesive 15.

It is desired that the upper surface of the emitter lower terminal 10 and the lower surface of the emitter upper terminal 12 are disposed in close contact with each other because the two terminals are to be laser-welded. Likewise, it is desired that the upper surface of the collector lower terminal 11 and the lower surface of the collector upper terminal 13 are disposed in close contact with each other because the two terminals are to be laser-welded. After the laser welding described previously, insulating sealing resin (not shown in FIG. 2) is poured into the inside of the resin case 14 until the parts exposing in the air of the upper terminals 12 and 13 are covered with the resin. Thus, a semiconductor module 20 is constructed.

A semiconductor module that is manufactured by applying the laser welding method of embodiments of the invention is provided with two types of bus bars of a P bus bar, which is a P-side common wiring after rectification, and an N bus bar, which is an N-side common wiring, as described earlier referring to FIG. 6. The P bus bar and the N bus bar are preferably arranged in parallel with different vertical positions in view of down-sizing of the module and reduction of circuit inductance. Consequently, laser welding points are positioned at different vertical places.

When all the IGBTs and FWDs composing the inverter circuit of FIG. 6 are assembled in a single semiconductor module, a total of 21 welding points are needed for welding the P-side common wiring and the N-side common wiring, and for welding to middle terminals. It is extremely difficult for so many welding points to arrange the terminals closely with a uniform gap between the opposing terminals at the laser welding points. In addition, it is desired for the laser welding machine to be capable of easy focus adjustment in laser irradiation process in order to perform the laser welding in a short time.

Figure 1:
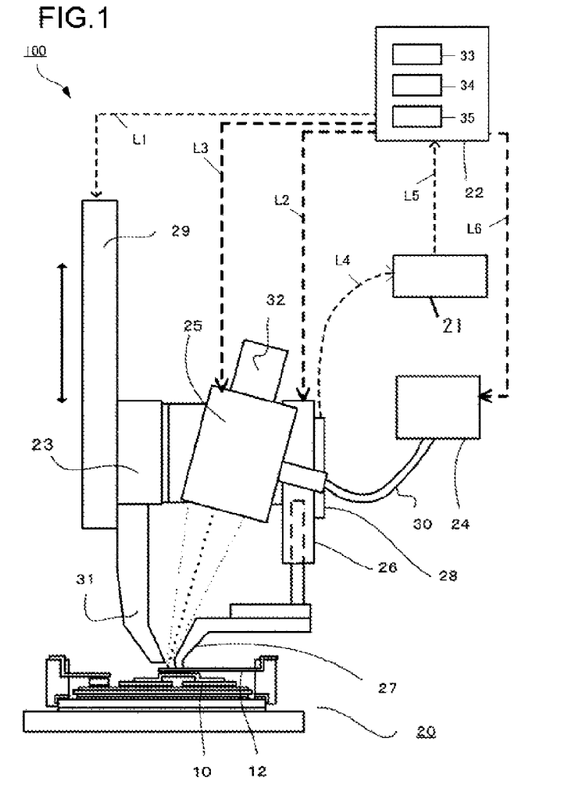
FIG. 1 is a schematic construction of a laser welding machine according to an embodiment of the present invention showing a situation in welding an upper and lower emitter terminals of a semiconductor module at an opposing place.

As shown in FIG. 1, a laser welding machine 100 of embodiments of the invention is a laser welding machine conducting welding, with laser light, a device in which a conductive lower terminal is overlapped by a conductive upper terminal, the laser welding machine 100 comprising; an elevator 29 having a mechanism that is capable of sliding an elevating platform 23; a pressing actuator 26 that is fixed to the elevating platform 23 at a base part of the pressing actuator 26 and has a tip 27 slidably connected to the base part and pressing the conductive upper terminal toward the conductive lower terminal; a laser oscillator 24; a machining optical device 25 that is fixed to the elevating platform 23 and has a lens to focus the laser light emitted from the laser oscillator 24; a position detector 28 that detects a vertical positioning of the pressing actuator 26; a counter 21 that receives an output signal of the position detector 28 and delivers position information; and a control circuit 22 that controls, based on the position information received from the counter, the elevator 29, the pressing actuator 26, and the machining optical device 25, and controls operation of the laser oscillator 24.

The control circuit 22 comprises a pressing regulation circuit 33, a laser focal distance signal output circuit 34, and a laser irradiation signal output circuit 35. The pressing regulation circuit 33 makes the elevating platform 23 slide until a change of an input signal from the counter 21 corresponding to the amount of sliding of the elevating platform 23 reaches a threshold value in order to obtain a stabilized close contact condition between the conductive upper terminal and the conductive lower terminal by sliding the elevating platform 23 of the elevator 29. The laser focal distance signal output circuit 34 delivers a signal for adjusting the laser focal distance to the machining optical device 25 based on the vertical position of the upper surface of the conductive upper terminal after a stabilized close contact condition is established. The laser irradiation signal output circuit 35 commands the laser oscillator to irradiate laser light. The laser oscillator 24 sends laser light through a transmission fiber 30 to the machining optical device 25, which irradiates the conductive upper terminal with laser light to weld the conductive upper terminal and the conductive lower terminal.

Therefore, a laser welding machine of embodiments of the present invention allows to readily conduct laser welding at opposing surfaces of the lower surfaces of the conductive upper terminals 12 and 13 positioned at different height and the upper surfaces of the conductive lower terminals 10 and 11 in a package of a semiconductor module 20.

The output signal from the position detector 28 is delivered to the counter 21 through a fourth signal wiring L4. The output of the counter 21 is given to the control circuit 22 through a fifth signal wiring L5.

The control circuit 22 controls the sliding movement of the elevating platform 23 of the elevator 29 through a first signal wiring L1, controls the pressing force of the pressing actuator 26 through a second signal wiring L2, controls the machining optical device 25 through a third signal wiring L3, and controls the laser oscillator 24 through a sixth signal wiring L6.

A laser welding machine of embodiments of the invention is provided with the pressing actuator 26, which not only detects vertical position information of the laser welding point, but also presses the emitter upper terminal 12 with the tip 27 thereof by downward movement of the pressing actuator 26, thereby making the upper and lower terminals in a stably compressed state despite the variation in adhering degree or a gap between the opposing surfaces of the upper and lower terminals at the welding point. Because laser welding is conducted after this stable adhered state has been established, any defective laser welding point is not generated. After a laser welding process, the pressing actuator 26 is raised and moved to the next laser welding point without changing the position of the elevating platform 23, thereby reducing the processing time. A laser welding machine of embodiments of the invention is preferably provided with a suction nozzle 31 for absorbing fumes such as smoke containing fine dusts generated in the laser welding process. A laser welding machine is also favorably provided with an imaging camera 32 for observing an enlarged image of the laser welding point.

Figure 3:
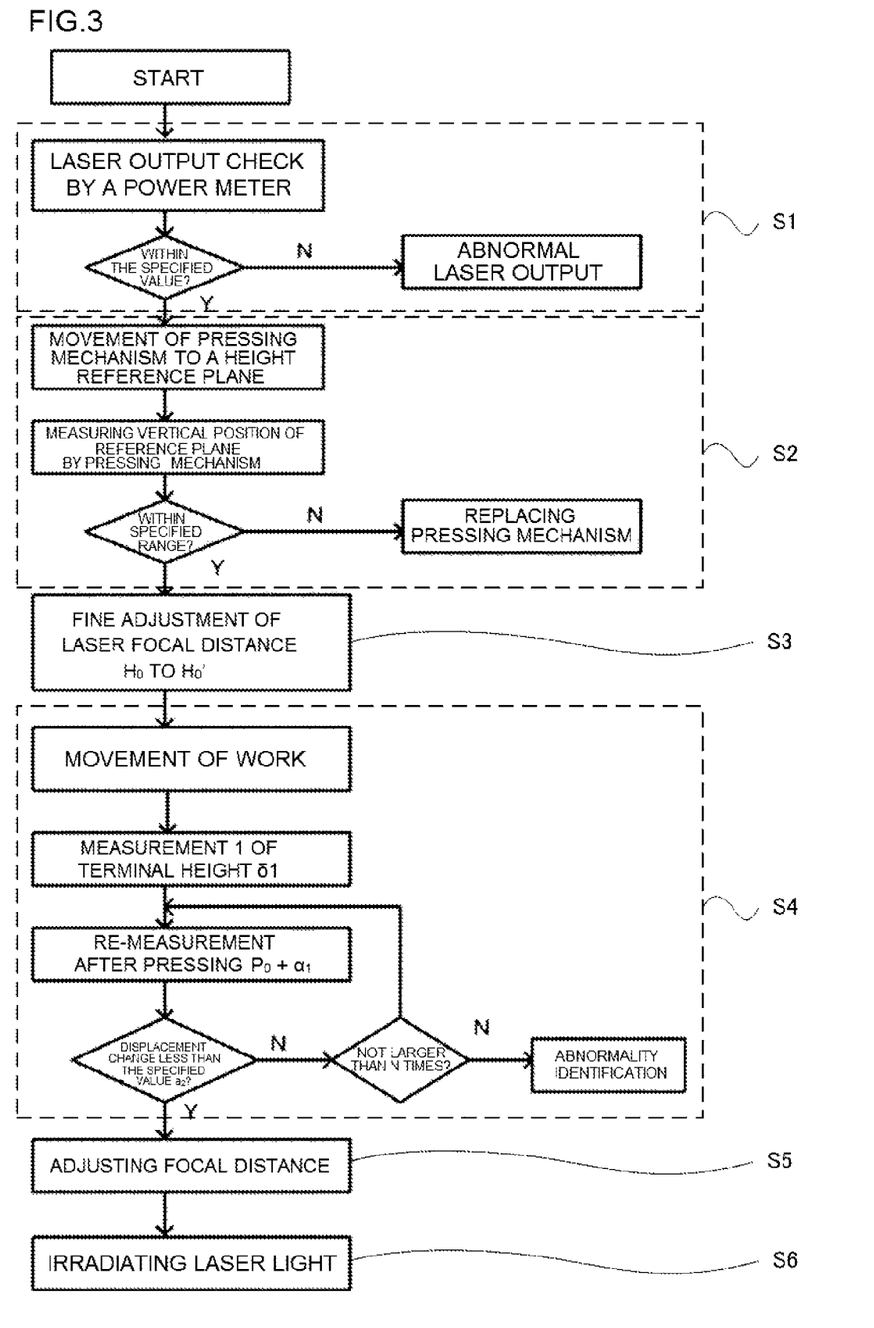
FIG. 3 is a flow diagram of the process of laser welding in a laser welding method of embodiments of the present invention.

A procedure of laser welding using the laser welding machine will be described in the following with reference to the laser welding flow chart of FIG. 3 and the construction of the laser welding machine of FIG. 1.

First in the laser output inspection process or step S1, the laser welding machine is certified to be in a normal condition with the laser output thereof within a specified range, and the procedure moves to a pressing mechanism inspection process or step S2. If the laser output exceeds the specified range, an alarm of abnormal laser output is given.

Then in the pressing mechanism inspection process or step S2, the tip 27 of the pressing actuator 26 is moved by the control circuit 22 to a position above a height reference plane set at a reference bed (not shown in the figures) and made in contact with the reference bed by downward movement of the pressing actuator 26 at a pressing force $P_0$. In this process, a position detector 28 attached to the pressing actuator 26 delivers a magnitude of displacement to the counter 21, which in turn gives the position information to the control circuit 22, which measures a reference height $\delta_1$. The initial reference displacement quantity $\delta_0$ in the design of the device is determined from the output of the counter 21 when the tip 27 is made just in contact with the reference bed at a pressure $P_0$. An initial reference focal distance Ho is preliminarily determined so that the focus of the laser light is coincide with the laser welding point.

A correction displacement quantity $\Delta\epsilon_1$ is obtained from the initial reference displacement quantity $\delta_0$ and the reference height $\delta_1$ of the reference plane measured at the pressing force $P_0$ according to the formula $\delta_1=\delta_0+\Delta\epsilon_1$. If the $\Delta\epsilon_1$ is within a predetermined range $a_1$, it is judged that the tip 27, which become in contact with the emitter upper terminal 12, does not have any wear or deformation, moving to a first laser focus adjusting process or step S3. If the $\Delta\epsilon1$ exceeds the predetermined range $a_1$, it is judged that the tip 27 has an abnormality and delivers an alarm.

In the first laser focus adjusting process or step S3, a primary correction reference focal distance $H_1$ is obtained from the initial reference focal distance $H_0$ in consideration of the correction displacement quantity $\Delta\epsilon_1$ for the measured reference height $\delta_1$ as follows:

$$H_1=H_0-\Delta\epsilon_1/\sin\theta,$$

where θ is an angle between the laser light and the upper surface of the emitter upper terminal 12.

In a pressing process or step S4, the control circuit 22 first moves the elevator 29 fixed onto a stage (not depicted in FIG. 1) capable of moving in the directions of horizontal two axes above the semiconductor module, which is a work necessary to be laser welded. After that, the tip 27 of the pressing actuator 26 attached to the elevating platform 23 is lowered just above the welding point at the opposing plane between the emitter lower terminal 10 of the IGBT chip and the emitter upper terminal 12. A pressure $P_0$ is exerted on the surface of the emitter upper terminal 12 by the tip 27 to measure and record the displacement quantity $\delta_{i+1}$ of the vertical position of the surface of the emitter upper terminal 12, wherein i is a positive integer with an initial value of 1. The control circuit 22 changes the pressing force to $P_0+\alpha_1 \times i$, wherein i is a positive integer with an initial value of 1, and measures and records again the vertical position of the upper surface of the emitter upper terminal 12 to obtain a displacement quantity $\delta_{i+2}$. $\Delta\epsilon_{i+1}$ is obtained from the displacement quantity $\delta_2$ at the pressing force of $P_0$ and the displacement quantity $\delta_{i+2}$ at the pressing force of $P_0+\alpha_1 \times i$ according to the formula $\delta_{i+1}=\delta_{i+2}-\Delta\epsilon_{i+1}$. When the absolute value of the $\Delta\epsilon_{i+1}$ is within the specified value $a_2$, it is judged that the gap between the emitter upper terminal 12 and the emitter lower terminal 10 is small and the terminals are adhered in a stable condition, moving to a second laser focus adjusting process or step S5. If the absolute value of the $\Delta\epsilon_{i+1}$ is out of the specified range $a_2$, i is changed to 2 adding 1 and the pressing force is change to $P_0+\alpha_1 \times i$, which means that the pressing force is increased by $\alpha_1$ corresponding to the increment of i by 1. The vertical position of the upper surface of the emitter upper terminal 12 is measured and recorded again as a displacement quantity $\delta_{i+2}$. This process is repeated until the absolute value of the $\Delta\epsilon_{i+1}$ becomes within the range of specified value $a_2$ up to the predetermined maximum times of n. If the absolute value of the $\Delta\epsilon_{i+1}$ does not fall within the specified value $a_2$, abnormality is determined and an alarm is delivered.

In a second laser focus adjusting process or step S5, the focal distance of the laser light is precisely adjusted. In consideration of the correction displacement quantity $\Delta\epsilon_{i+1}$ of the measured height $\delta_{i+2}$, a secondary correction reference focal distance $H_2$ is corrected as follows.

$$H_2 = H_1 - \sum_{i=1}^{m} \left(\frac{\Delta\varepsilon_{i+1}}{\sin\theta}\right)$$

Wherein $\theta$ is an angle between the laser light and the upper surface of the emitter upper terminal 12.

Then in a laser irradiating process or step S6, laser welding is conducted. Because laser light irradiates the upper surface of the emitter upper terminal 12 in an oblique direction, the focal position seen from above shifts in the horizontal direction corresponding to a change of focal distance of the laser light. Therefore, it is preferable to perform laser welding after adjusting the focal position of the laser light by moving the elevator 29 mounted on a stage (not depicted) movable in two axial directions in a horizontal plane. This correction operation can be omitted when the amount of shift of the focal position is minute and has no effect on the tip 27.

After completion of the laser welding, the control circuit 22 makes the pressing actuator 26 elevated to release the tip 27 from the emitter upper terminal 12.

Then, the laser welding machine shifts relatively the position of the machining optical device 25 and the position of the semiconductor module to move the focal position of laser light of the machining optical device 25 to the next welding point.

Like the previous case, the welding point at the opposing surface between the collector lower terminal 11 connected to the collector at the back surface of the chip and the collector upper terminal 13 is laser welded. The laser welding region 16 is indicated with an area of slanted lines in FIG. 2. The elevating platform 23 has a suction nozzle 31 that has a suction port disposed near the surface of the laser welding point to remove the fume scattering in the welding process. Useful laser light 17 can be YAG laser light at a wavelength $\lambda=1,064$ nm. Alternatively, the laser light 17 can be $CO_2$ laser light or excimer laser light.

The laser light 17 is absorbed at the uppermost surface of the upper terminals 12 and 13 and converted to thermal energy to proceed melting of the terminals and form a welding region 16. As a result, the upper terminals 12 and 13 are joined with the lower terminals 10 and 11, respectively, to electrically connect and form a main current path. After sequentially moving and laser welding at every welding points required for assembling the semiconductor module, the laser welding procedure is completed.

According to the embodiment described thus far, provided are a laser welding machine and a laser welding method that achieve enough joint strength despite certain amount of variation in the distance between upper and lower metallic plates that are to be welded.

REFERENCE NUMERALS AND ELEMENTS LIST

1: heat sink base
2: solder
3: DCB back surface copper foil
4: DCB ceramics
5: DCB front surface copper foil
6a: solder
6b: solder
7a: IGBT chip
7b: diode chip
8a: solder
8b: solder
9: solder
10: emitter lower terminal
11: collector lower terminal
12: emitter upper terminal
13: collector upper terminal
14: resin case
15: silicone adhesive
16: welding region
17: laser light
18: dotted circle
20: semiconductor module
21: counter
22: control circuit
23: elevating platform
24: laser oscillator
25: machining optical device
26: pressing actuator
27: tip
28: position detector
29: elevator
30: transmission fiber
31: suction nozzle
32: imaging camera
33: pressing regulation circuit
34: laser focal distance signal output circuit
35: laser irradiation signal output circuit
100: laser welding machine L1: first signal wiring
L2: second signal wiring
L3: third signal wiring
L4: fourth signal wiring
L5: fifth signal wiring
L6: sixth signal wiring
S1: laser output inspection
S2: pressing mechanism inspection
S3: first laser focus adjusting
S4: pressing
S5: second laser focus adjusting
S6: laser irradiating

What is claimed is:

1. A laser welding machine for welding, with laser light, a device in which a conductive lower terminal is overlapped by a conductive upper terminal, the laser welding machine comprising;
an elevator having a mechanism that is capable of sliding an elevating platform;
a pressing actuator that is fixed to the elevating platform at a base part of the pressing actuator and has a tip slidably connected to the base part and pressing the conductive upper terminal toward the conductive lower terminal;
a laser oscillator;
a machining optical device that is fixed to the elevating platform and has a lens to focus the laser light emitted from the laser oscillator;
a position detector that detects a vertical positioning of the pressing actuator;
a counter that receives an output of the position detector and delivers position information; and
a control circuit that controls, based on the position information received from the counter, the elevator, the pressing actuator, and the machining optical device, and controls operation of the laser oscillator.

2. The laser welding machine according to claim 1, wherein the control circuit comprises:
a pressing regulation circuit that makes the elevating platform slide until a change of an input signal from the counter corresponding to an amount of sliding of the elevating platform reaches a threshold value in order to obtain a stabilized close contact condition between the conductive upper terminal and the conductive lower terminal by sliding the elevating platform of the elevator;
a laser focal distance signal output circuit that delivers a signal for adjusting a laser focal distance to the machining optical device based on a vertical position of an upper surface of the conductive upper terminal after the stabilized close contact condition is established; and
a laser irradiation signal output circuit that commands the laser oscillator to irradiate laser light.

3. The laser welding machine according to claim 1, wherein a power source of the pressing actuator is supplied by compressed air or a voltage.

4. The laser welding machine according to claim 1, wherein the tip has such a configuration that does not shade the laser light and allows contact with a vicinity of a laser irradiation point.

5. The laser welding machine according to claim 1, further comprising a suction nozzle having a suction port that is fixed to the elevating platform and disposed at a vicinity of a laser irradiation point.

6. The laser welding machine according to claim 2, wherein a power source of the pressing actuator is supplied by compressed air or a voltage.

7. The laser welding machine according to claim 2, wherein the tip has such a configuration that does not shade the laser light and allows contact with a vicinity of a laser irradiation point.

8. The laser welding machine according to claim 2, further comprising a suction nozzle having a suction port that is fixed to the elevating platform and disposed at a vicinity of a laser irradiation point.

9. A laser welding method using the laser welding machine as defined by claim 1, the method comprising:
repeatedly performing pressing regulated by the control circuit;
performing arithmetic operation of a focal distance of the laser light based on a vertical position of a laser irradiation point and delivering results of the arithmetic operation to the elevator and the machining optical device; and
commanding the machining optical device to irradiate the laser light; in which
the control circuit in the pressing makes the pressing actuator move to press an upper surface of the conductive upper terminal at a pressure of $P_0$ with the tip of the pressing actuator, and to press again at an increased pressure until a difference in a displacement of the pressing actuator measured according to an output signal from the counter between a value at the pressure $P_0$ and a value at a pressure larger than $P_0$ exerted by further moving the pressing actuator becomes within a predetermined range of $a_2$.

10. A laser welding method using the laser welding machine as defined by claim 2, the method comprising:
repeatedly performing pressing regulated by the control circuit;
performing arithmetic operation of a focal distance of the laser light based on a vertical position of a laser irradiation point and delivering results of the arithmetic operation to the elevator and the machining optical device; and
commanding the machining optical device to irradiate the laser light; in which
the control circuit in the pressing makes the pressing actuator move to press an upper surface of the conductive upper terminal at a pressure of $P_0$ with the tip of the pressing actuator, and to press again at an increased pressure until a difference in a displacement of the pressing actuator measured according to an output signal from the counter between a value at the pressure $P_0$ and a value at a pressure larger than $P_0$ exerted by further moving the pressing actuator becomes within a predetermined range of $a_2$.

* * * * *